(12) United States Patent
Bedarida et al.

(10) Patent No.: US 11,443,820 B2
(45) Date of Patent: Sep. 13, 2022

(54) MEMORY DEVICE, MEMORY ADDRESS DECODER, SYSTEM, AND RELATED METHOD FOR MEMORY ATTACK DETECTION

(71) Applicant: Microchip Technology Incorporated, Chandler, AZ (US)

(72) Inventors: Lorenzo Bedarida, Vimercate (IT); Simone Bartoli, lecco (IT); Albert S. Weiner, Colorado Springs, CO (US)

(73) Assignee: Microchip Technology Incorporated, Chandler, AZ (US)

(*) Notice: Subject to any disclaimer, the term of this patent is extended or adjusted under 35 U.S.C. 154(b) by 7 days.

(21) Appl. No.: 15/956,526

(22) Filed: Apr. 18, 2018

(65) Prior Publication Data

US 2019/0228831 A1  Jul. 25, 2019

Related U.S. Application Data

(60) Provisional application No. 62/620,699, filed on Jan. 23, 2018.

(51) Int. Cl.
| | | |
|---|---|---|
| *G11C 29/02* | (2006.01) | |
| *G06F 13/28* | (2006.01) | |
| *G11C 8/10* | (2006.01) | |
| *G11C 16/08* | (2006.01) | |
| *G11C 7/24* | (2006.01) | |
| *G11C 8/20* | (2006.01) | |

(Continued)

(52) U.S. Cl.
CPC .......... *G11C 29/024* (2013.01); *G06F 13/28* (2013.01); *G11C 7/24* (2013.01); *G11C 8/10* (2013.01); *G11C 8/20* (2013.01); *G11C 16/08* (2013.01); *G11C 29/02* (2013.01); *G11C 29/44* (2013.01); *G11C 29/38* (2013.01)

(58) Field of Classification Search
CPC ......... G11C 29/024; G11C 16/08; G11C 8/10; G11C 8/20; G11C 7/24; G06F 13/28
See application file for complete search history.

(56) References Cited

U.S. PATENT DOCUMENTS

| | | | |
|---|---|---|---|
| 3,049,692 A | * | 8/1962 | Hunt ................ G11C 11/06014 |
| | | | 714/824 |
| 3,657,700 A | | 4/1972 | Lutzker |

(Continued)

FOREIGN PATENT DOCUMENTS

EP    2814034 A2    12/2014

OTHER PUBLICATIONS

Rennels et al., "Concurrent Error Detection in Self-Timed VLSI", 0363-8928/94, 1994 IEEE (Year: 1994).*

(Continued)

*Primary Examiner* — April Y Blair
*Assistant Examiner* — Rong Tang
(74) *Attorney, Agent, or Firm* — TraskBritt

(57) ABSTRACT

A memory device, memory address decoder, a memory system and related method for memory attack detection are disclosed. An apparatus includes a memory decoder include multiple stages in a decoding path configured to generate a select signal from an input address signal, and fault detecting logic operably coupled with the memory decoder and configured to receive feedback signals distributed from the multiple stages indicative of a fault along the decoding path.

18 Claims, 6 Drawing Sheets

(51) Int. Cl.
*G11C 29/44* (2006.01)
*G11C 29/38* (2006.01)

(56) References Cited

U.S. PATENT DOCUMENTS

| | | | |
|---|---|---|---|
| 4,858,233 A * | 8/1989 | Dyson | H03K 19/00392 |
| | | | 714/3 |
| 4,912,710 A * | 3/1990 | Rolfe | G11C 29/02 |
| | | | 714/718 |
| 5,949,712 A | 9/1999 | Rao et al. | |
| 6,044,012 A | 3/2000 | Rao et al. | |
| 6,337,807 B2 | 1/2002 | Futatsuyama et al. | |
| 6,487,139 B1 | 11/2002 | Pathak | |
| 6,549,458 B1 | 4/2003 | Rao et al. | |
| 6,947,328 B1 | 9/2005 | Smidt et al. | |
| 7,042,772 B2 | 5/2006 | Wang et al. | |
| 7,203,124 B2 | 4/2007 | Kim et al. | |
| 7,495,965 B2 | 2/2009 | Suzuki et al. | |
| 7,505,355 B2 | 3/2009 | Kanda et al. | |
| 7,542,351 B2 | 6/2009 | Choy et al. | |
| 7,583,533 B2 | 9/2009 | Kutsukake et al. | |
| 7,633,095 B1 | 12/2009 | Kerr et al. | |
| 7,701,785 B2 | 4/2010 | Sanjeevarao et al. | |
| 7,859,009 B1 | 12/2010 | Kerr et al. | |
| 7,969,200 B2 | 6/2011 | Tomoeda et al. | |
| 7,974,051 B2 | 7/2011 | Sato et al. | |
| 7,989,889 B1 | 8/2011 | Kerr et al. | |
| 8,003,469 B2 | 8/2011 | Lee et al. | |
| 8,009,481 B2 | 8/2011 | Nirschl | |
| 8,049,259 B2 | 11/2011 | Noguchi et al. | |
| 8,049,267 B2 | 11/2011 | Sugimae et al. | |
| 8,054,694 B2 | 11/2011 | Racape | |
| 8,076,192 B2 | 12/2011 | Taniguchi et al. | |
| 8,089,816 B2 | 1/2012 | Yamada et al. | |
| 8,134,882 B2 | 3/2012 | Dono | |
| 8,837,252 B2 | 9/2014 | Bedarida et al. | |
| 9,824,732 B2 | 11/2017 | Weiner | |
| 2007/0002616 A1 | 1/2007 | Wuidart et al. | |
| 2007/0171589 A1 | 7/2007 | Otake | |
| 2008/0252634 A1 | 10/2008 | Sato et al. | |
| 2009/0194841 A1 | 8/2009 | Magome et al. | |
| 2009/0236672 A1 | 9/2009 | Harashima et al. | |
| 2009/0282319 A1 * | 11/2009 | No | H03M 13/2906 |
| | | | 714/780 |
| 2010/0107006 A1 | 4/2010 | Fey et al. | |
| 2010/0202183 A1 | 8/2010 | Kurjanowicz | |
| 2011/0103149 A1 | 5/2011 | Katsumata et al. | |
| 2012/0044733 A1 | 2/2012 | Scheuerlein | |
| 2012/0044759 A1 | 2/2012 | Takahashi | |
| 2012/0243344 A1 * | 9/2012 | Fontana | G11C 16/08 |
| | | | 365/189.11 |
| 2013/0301348 A1 * | 11/2013 | Perroni | G11C 8/10 |
| | | | 365/163 |
| 2017/0040043 A1 | 2/2017 | Weiner | |

OTHER PUBLICATIONS

International Search Report for International Application No. PCT/US2019/013859, dated Mar. 27, 2019, 3 pages.

International Written Opinion for International Application No. PCT/US19/13859, dated Mar. 27, 2019, 10 pages.

Tanzawa et al; Circuit Techniques for a 1.8-V-Only NAND Flash Memory; Jan. 2002; pp. 84-89; IEEE Journal of Solid-State Circuits.

* cited by examiner

MEMORY DEVICE, MEMORY ADDRESS DECODER, SYSTEM, AND RELATED METHOD FOR MEMORY ATTACK DETECTION

CROSS-REFERENCE TO RELATED APPLICATION

This application claims the benefit under 35 U.S.C. § 119(e) of U.S. Provisional Patent Application Ser. No. 62/620,699, filed Jan. 23, 2018, the entire contents and disclosure of which is hereby incorporated herein by this reference.

FIELD

The embodiments described herein relate, generally, to memory systems and fault detection within memory systems.

BACKGROUND

Fault injection is a method of attack on secure integrated circuit (IC) chips. There are many forms of fault injection, including power supply excursion, temperature spikes, IR laser light, logical attack, focused ion beam and microprobing. These methods may be intended to disrupt the normal operation of the secure chip, with the intent of causing the chip to execute incorrectly (e.g., causing memory to misaddress) and allow access to protected contents or to validate an incorrect code. An example of an existing technique for detecting such an attack is to couple a read-only memory (ROM) that shares the wordlines at the end of the memory array, such as is described in U.S. Pat. No. 9,824,732, issued Nov. 21, 2017, and entitled "Memory System with Encoding." Such a system may have drawbacks such as needing to add latches that store results when the read ends, complexity of the timing signals, pre-charge phase, and write attack detection. Additional conventional methods may include exporting an address outside of the memory array to perform an integrity check. These and other methods of detecting and mitigating fault injection may have other drawbacks.

BRIEF SUMMARY

In an embodiment, an apparatus comprises a memory decoder including multiple stages in a decoding path configured to generate a select signal from an input address signal, and fault detecting logic operably coupled with the memory decoder and configured to receive feedback signals distributed from the multiple stages indicative of a fault along the decoding path.

In another embodiment, a method of detecting fault within a memory device is disclosed. The method comprises decoding an input signal via a memory decoder including multiple stages in a decoding path to generate a select signal from an input address signal, generating feedback signals distributed within the multiple stages, and transmitting the feedback signals to fault detecting logic indicative of a fault along the decoding path.

In another embodiment, a method of detecting fault within a memory device is disclosed. The method comprises detecting, via fault detecting logic for the memory device, a fault along a decoding path responsive to feedback signals distributed from multiple stages of a memory decoder of the memory device, and generating a fault alarm signal responsive to detecting the fault.

BRIEF DESCRIPTION OF THE DRAWINGS AND APPENDIX

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
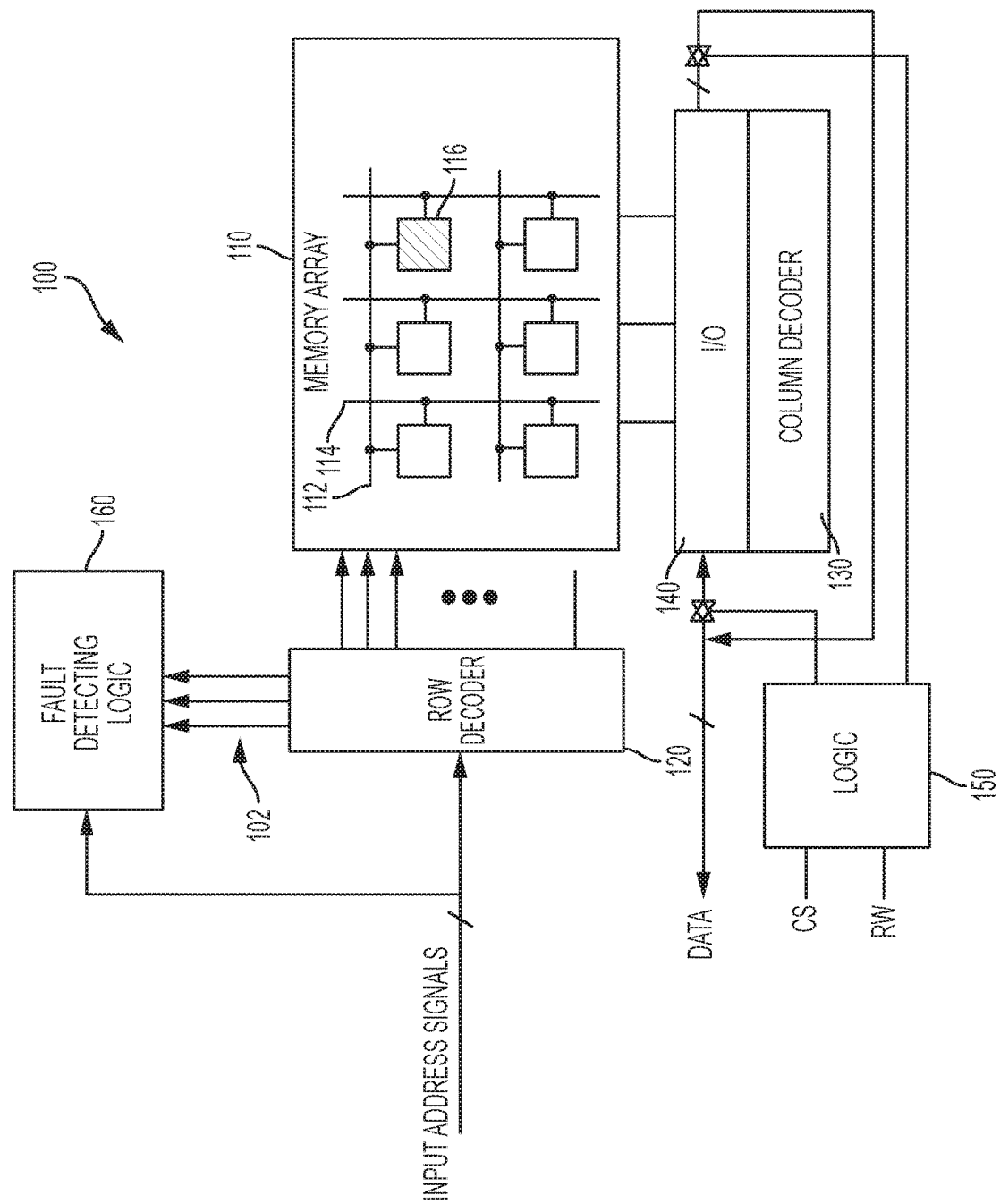
FIG. 1 is a simplified schematic block diagram of a memory system with fault detection according embodiments of the disclosure.

In the following detailed description, reference is made to the accompanying drawings which form a part hereof, and in which is shown by way of illustration specific embodiments in which the disclosure may be practiced. These embodiments are described in sufficient detail to enable those of ordinary skill in the art to practice the disclosure. It should be understood, however, that the detailed description and the specific examples, while indicating examples of embodiments of the disclosure, are given by way of illustration only and not by way of limitation. From this disclosure, various substitutions, modifications, additions rearrangements, or combinations thereof within the scope of the disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the disclosure may be implemented on any number of data signals including a single data signal.

It should be understood that any reference to an element herein using a designation such as "first," "second," and so forth does not limit the quantity or order of those elements, unless such limitation is explicitly stated. Rather, these designations are used herein as a convenient method of distinguishing between two or more elements or instances of an element. Thus, a reference to first and second elements does not mean that only two elements can be employed or that the first element must precede the second element in some manner. Also, unless stated otherwise a set of elements may comprise one or more elements. Likewise, sometimes elements referred to in the singular form may also include one or more instances of the element.

Embodiments relate generally to techniques for fault detection of a secure system or memory device configured to store secure information. An attacker could potentially attempt to inject faults into the memory device (e.g., via IR light), while intending that the data read from a block be altered at a critical time of execution. Embodiments of the disclosure may be implemented in conjunction with a memory array, row decoder, column decoder, column input/output (I/O) module, logic, and/or encoder. The memory array may include multiple memory cells coupled to word lines and bit lines. A fault detector may be implemented within the row decoder and/or the column decoder. The memory array may be configured as RAM, ROM, Flash Memory, or other memory configurations. Embodiments of the disclosure may also include a microcontroller system including a memory device coupled thereto. The memory device may include internal fault detection and address integrity management functionality as described herein. Such a microcontroller system may include one or more of a processor, Direct Memory Access (DMA), peripherals, memory controller coupled to system bus along with the memory device including the fault detection. A system bus may include a data bus, an address bus and a control bus. Address signals are placed on the address bus by memory controller and/or DMA to read or write from a memory device. The memory device includes a memory array and other circuitry and/or logic to perform the processes and fault detection described herein. Embodiments of the present disclosure also include embedded systems having memory such as in controllers used for encrypted communication, ATMs, or other systems. Additional embodiments include secure systems including those in which pre-coder paths and/or decoder paths are secure paths.

FIG. 1 is a simplified schematic block diagram of a memory system 100 with fault detection according embodiments of the disclosure. The memory system 100 may include a memory array 110, a row decoder 120, a column decoder 130, a column input/output (I/O) module 140, logic 150, and fault detecting logic 160. The memory array 110 includes word lines 112 and bit lines 114 operably coupled to memory cells 116. The memory array 110 may be configured as RAM, ROM, EEPROM, Flash Memory, or other memory configurations.

In operation, input address signals are received by the row decoder 120 and the column decoder 130. The row decoder 120 and the column decoder 130 are configured to reduce the number of input address signals to a smaller number of selection signals for selecting memory cells 116 from the memory array 110. The decoders 120, 130 decode the input address signals, and using word lines 112 and bit lines 114 select a memory element (e.g., one or more memory cells 116 such as a byte) in the memory array 110. The row decoder 120 and the column decoder 130 may each include logic gates for selecting word lines 112 and bit lines 114. The column 110 module 140 may include circuitry (e.g., multiplexers, buffers, sense amplifiers) for reading data from and writing data to the selected memory cells 116. The reading and writing of data from and to the selected memory cells 116 may be controlled by control signals generated by the logic 150.

The fault detection logic 160 may be configured to receive feedback signals 102 from fault detection elements distributed throughout the different stages to detect possible attacks. Each stage may report back to the fault detecting logic 160 that is configured to analyze the feedback signals from each stage and determine if a fault is present as will be discussed in further detail below. The fault detecting logic 160 may generate a fault alarm signal responsive to determining the presence of the fault along the decoder path.

Figure 6:
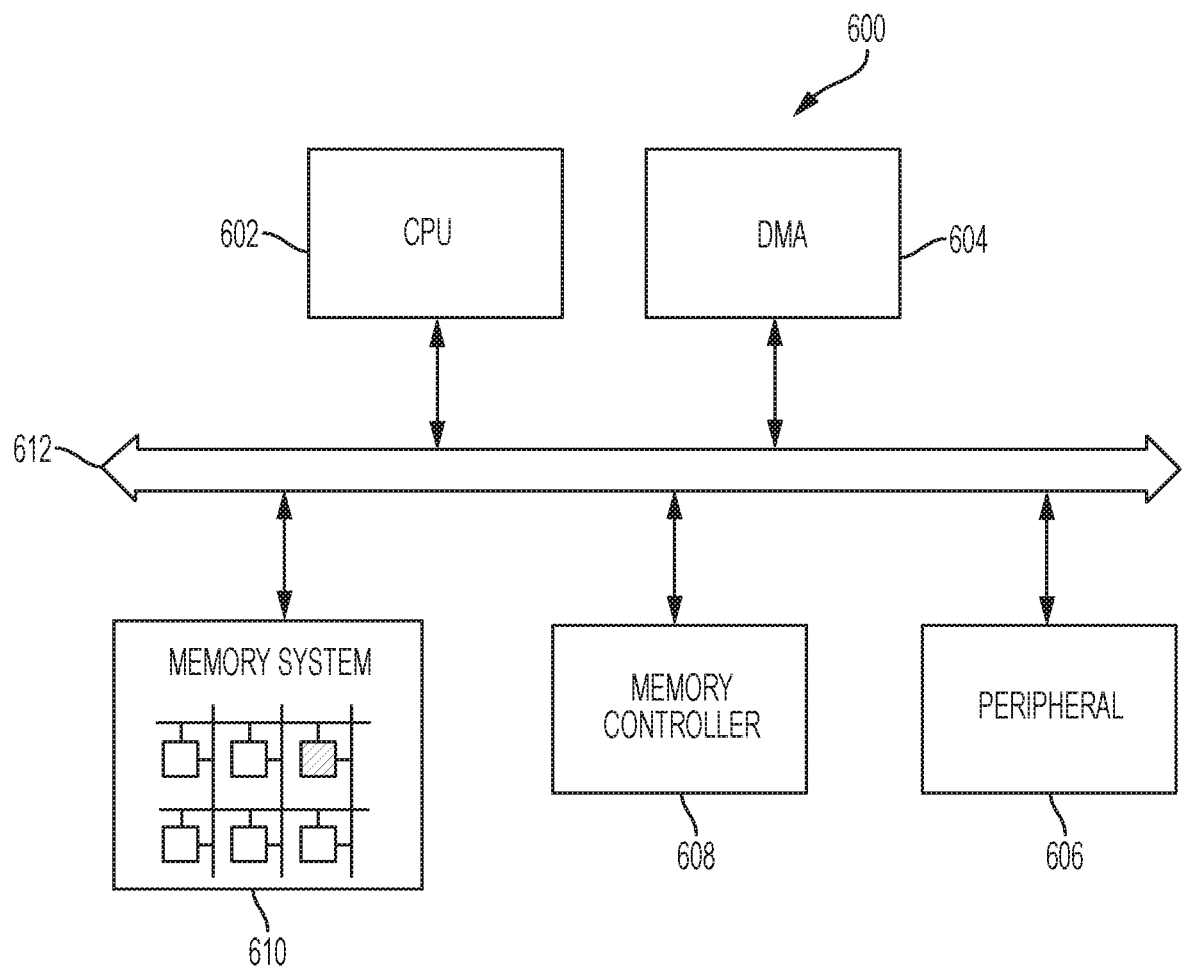
FIG. 6 is a simplified schematic block diagram of an example electronic system including a memory system with fault detection according to embodiments of the disclosure.

Although the fault detecting logic 160 is shown in FIG. 1 to be implemented with the row decoder 120, embodiments of the disclosure also include implementation of the fault detecting logic 160 with the column decoder 130. Embodiments may also include each of the row decoder 120 and the column decoder 130 coupled to the fault detecting logic 160, or separate fault detecting logic dedicated for each of the row decoder 120 and the column decoder 130. The fault detecting logic 160 may be located inside the memory device and/or outside the memory device (e.g., within the microcontroller or other device) of an electronic system (FIG. 6). In some embodiments, portions of the fault detecting logic 160 may be spread throughout different devices of the system. For example, some feedback signals may be received and analyzed by the memory device and other feedback signals may be received and analyzed by the microcontroller or any other combination of devices within the system.

Embodiments of the disclosure include an apparatus comprising a memory decoder including multiple stages in a decoding path configured to generate an output signal from an input address signal, and fault detecting logic operably coupled with the memory decoder and configured to receive feedback signals distributed from the multiple stages indicative of a fault along the decoding path.

Figure 2:
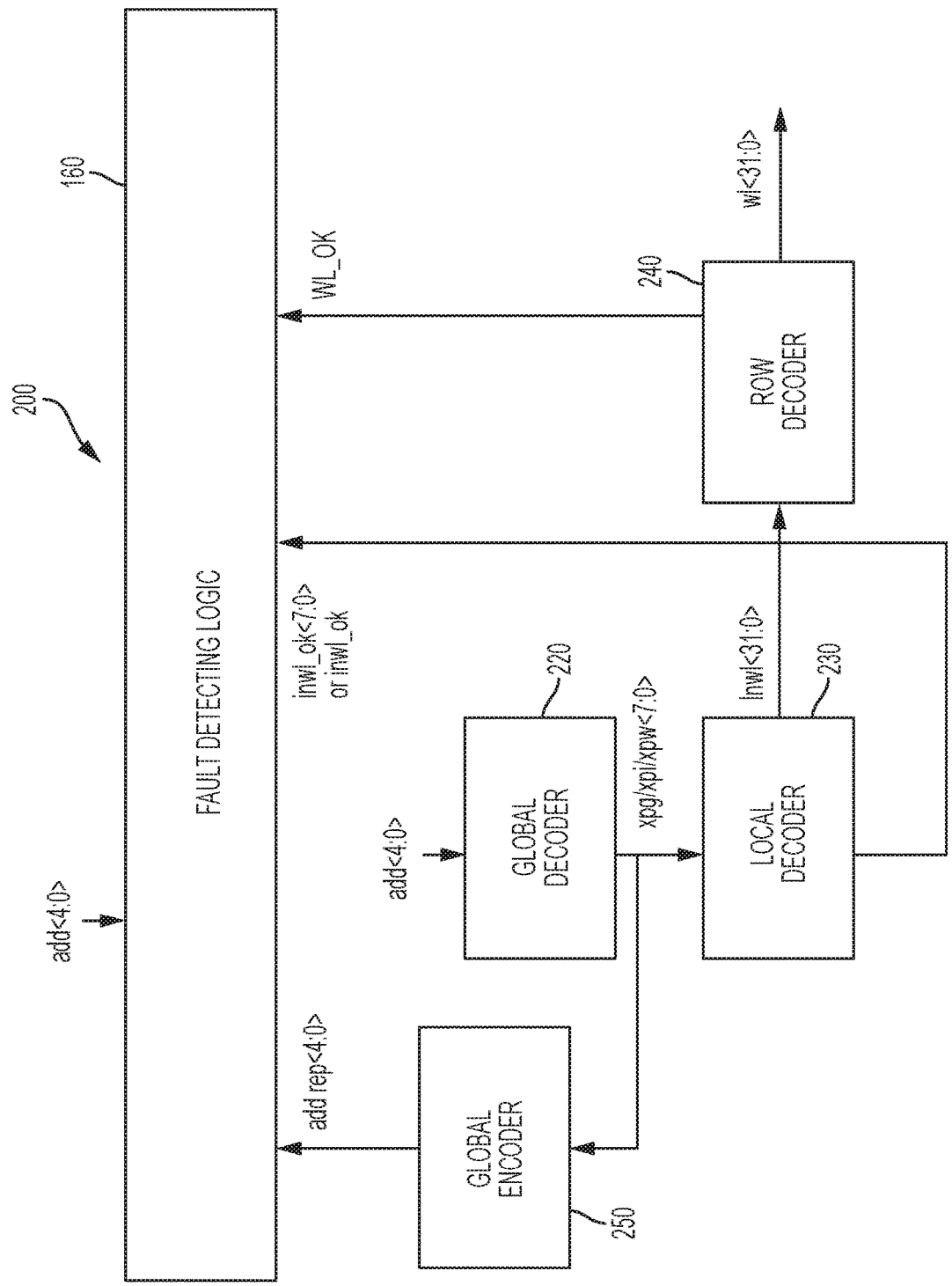
FIG. 2 is a simplified schematic block diagram of a fault detector and decoder according to an embodiment of the disclosure.

FIG. 2 is a simplified schematic block diagram of a fault detector and decoder 200 according to an embodiment of the disclosure. The fault detector and decoder 200 includes the fault detecting logic 160, a global decoder 220, a local decoder 230, and a row decoder 240 operably coupled in series to decode an input address (e.g., add<4:0>) received from the memory controller to a select signal (e.g., wl<31:0>) for accessing the selected wordline or bitline of the memory array (FIG. 1). The input address may be a binary number with values 0 through the highest numbered row. The resulting select signal is generated for the row itself that is selected (i.e., activated). As discussed above, the fault detecting logic 160 may be implemented with a row decoder and/or a column decoder. As such the decoder stages 220, 230, 240 may be part of either the row decoder or the column decoder of FIG. 1.

The decoding of the input address to the select signal occurs in stages, such as the global decoder 220 decoding the input address to a first intermediate address (e.g., xpg/xpi/xpw<7:0>), which is then decoded to a second intermediate address (e.g., inwl<31:0>) and further to the select signal. The select signal shown in FIG. 2 is a wordline select address. As fault detection elements may be implemented and distributed within a row decoder or a column decoder, the select signal may be a wordline address or a bitline address depending on the type of decoder. In some embodiments, each of the row decoder or the column decoder may include its own fault detector. In addition, the example shown in FIG. 2 decodes (and provides fault detection for) a 5 bit input address signal from the memory controller to a 32 bit select signal signal to the memory array. Different sizes of memory arrays are contemplated. The decoder may be scaled as understood by those of ordinary skill in the art to accommodate the size of memory array and addresses needed. For example, additional stages may be added to the decoding path.

The global decoder 220 is a pre-coding stage that is configured to generate the first intermediate address from the input address. Referring to FIG. 2, the global decoder 220 may utilize add<2:0> to generate xpw<7:0>, add<3> to generate xpwi<2:0>, and add<4> to generate xpg<1:0>. The local decoder 230 is a decoding stage configured to generate the second intermediate address from the first intermediate address. For example, the first intermediate addresses xpw<7:0>+xpwi<1:0>+xpg<1:0> may be utilized to generate inwl<31:0>. The row decoder 240 may be a final decoding stage configured to generate the select signal from the second intermediate address (or prior intermediate address if more stages are present). For example, the second intermediate address inwl<31:0> may be utilized to generate the select signal wl<31:0>.

As discussed above, embodiments of the disclosure may include fault detection elements distributed throughout the different stages to regenerate original addresses and to detect possible attacks. Each stage may report back to the fault detecting logic 160 that is configured to analyze the feedback signals from each stage and determine if a fault is present.

The fault detector and decoder 200 also includes a global encoder 250 operably coupled to the output of the global decoder 220. The global encoder 250 receives the first intermediate output from the global decoder 220 and is configured to perform an encoding operation that is the reverse of the global decoder 220. As a result, the global encoder 250 is configured to generate a replica address (e.g., add_rep<4:0>) that is transmitted to the fault detecting logic 160. The fault detecting logic 160 may compare the replica address with the initial input address from the memory controller to determine if they are the same. If not, a fault is detected and it is known that at least the global decoder 220 has been compromised. The local decoder 230 includes decoder circuitry and integrated fault detection circuitry configured to detect a possible attack on intermediate decoding signals.

Figure 3:
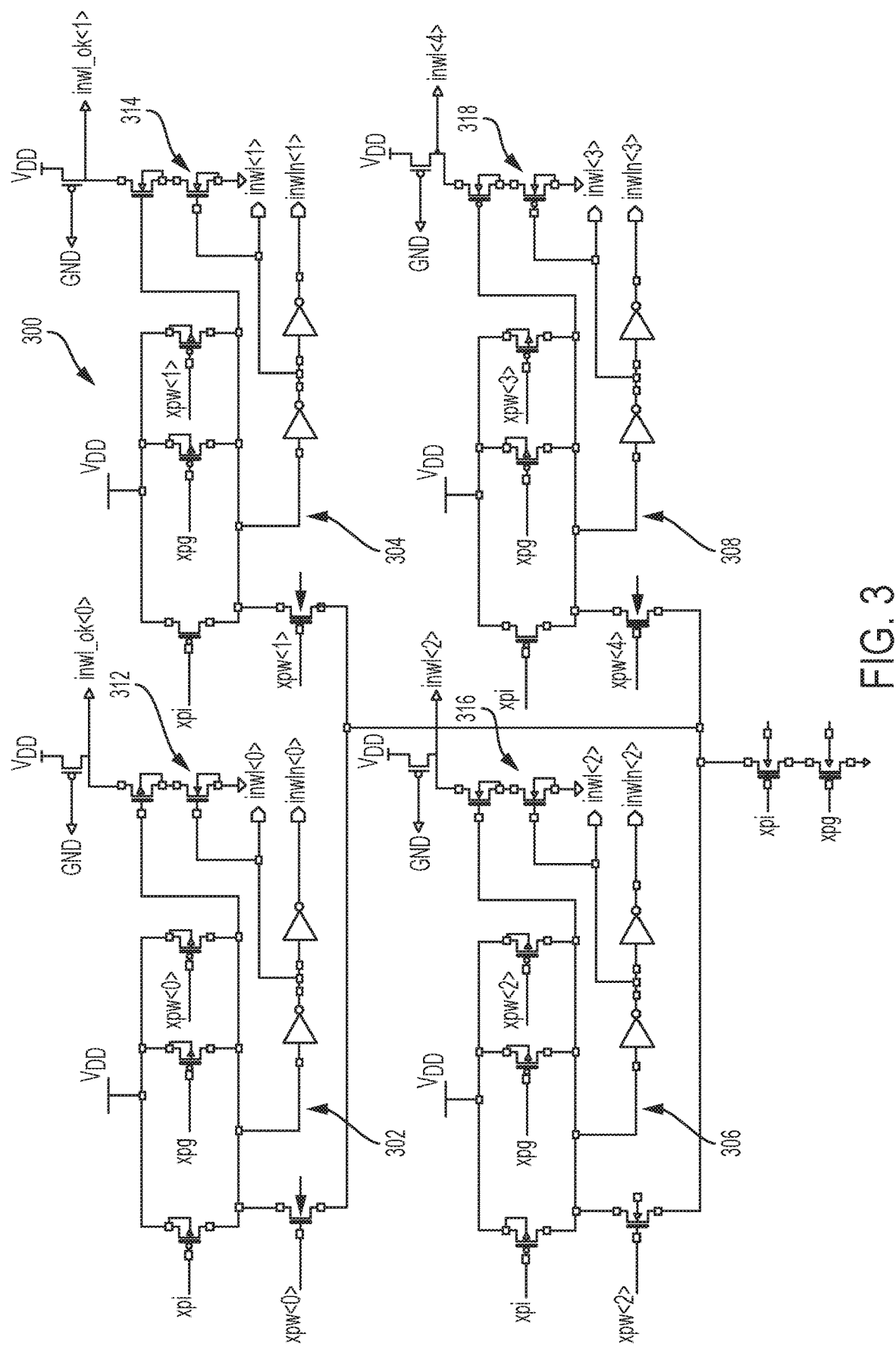
FIG. 3 is a schematic circuit diagram of the decoder circuitry and the integrated fault detection circuitry.

FIG. 3 is a schematic circuit diagram 300 of a portion of decoder circuitry 302-308 and integrated fault detection circuitry 312-318 for the local decoder 230 (FIG. 2). The portion of the decoder circuitry 302-308 shown in FIG. 3 generates a portion (e.g., inwl<3:0>) of the second intermediate addresses (e.g., inwl<31:0>) from the first intermediate addresses xpw<7:0>+xpwi<1:0>+xpg<1:0> received by the global decoder 220 (FIG. 2). It should be understood that additional portions of decoder circuitry and integrated fault detection circuitry may be added to scale the local decoder depending on the size of the memory array.

The integrated fault detection circuitry 312-318 is configured to determine whether each output bit of its decoder path is the correct bit based on analyzing the bit along with another bit within its respective decoder path. In some embodiments, the output bit and the other bit within the decoder path may be compared with an AND operation. For example, each portion of the decoder circuitry 302-308 may be coupled to a respective integrated fault detection circuit 312-318 that receives the first output bit inwl<0> of the second intermediate addresses and at least one additional bit from the decoder path (e.g., the control bit that is input to an inverter to generate the first output bit inwl<0>). For example, integrated fault detection circuit 312 may include at least two transistors coupled in series that are controlled by inwl<0> and its previous control bit. The serially coupled transistors are further coupled between $G_{ND}$ and a resistive pull up transistor. Each resistive pull up transistor may include a P-channel transistor coupled to the $V_{DD}$ power source and its gate tied to $G_{ND}$ to output each feedback output bit inwl<0> to inwl<4>.

The control bits should be opposite if no fault is present. Thus, a 0 and a 1 received by the integrated fault detection circuit 312 may generate a 0 that causes its respective pull up transistor to be enabled for intermediate feedback signal inwl_ok<0> to be pulled up to $V_{DD}$ indicating no fault is present. If a 1 and a 1 are received by the integrated fault detection circuit 312, a 1 may be generated that overrides the respective pull up transistor for intermediate feedback signal inwl_ok<0> to not be pulled up—thus, indicating a fault is present. In this embodiment, a 0 and a 0 may yield a 0 that enables its respective pull up transistor. Even though receiving a 0 and a 0 technically may be caused by a fault, the fault detection logic may still output a bit indicative of no fault being present in order to conserve space. In some embodiments, different circuit configurations and/or logic functions may be implemented. For example, an XOR gate may be used that may improve accuracy at the expense of additional circuitry. Other configurations are also contemplated, such as transistors coupled as an AND gate in series between VDD and inlw ok<0>. In addition, different configurations and logic functions may result in different configurations (or the absence) of the pull up transistors.

Other bits may be used may be used for determining the presence of a fault. For example, the control bit and the inverted output bit inwln<0> may be compared, which should be the same rather than opposite. In that case, a NAND gate may be used such that a 1 and a 1 received by the integrated fault detection circuit 312 may generate a 0 for intermediate feedback signal inwl_ok<0> indicating a fault is not present, while a 0 and a 1, a 1 and a 0, or a 0 and a 0 received by the integrated fault detection circuit 312 may generate a 1 for intermediate feedback signal inwl_ok<0> indicating a fault is present. Other gates such as OR or NOR may also be implemented depending on which combinations of bits are to be analyzed for determining the presence of a fault.

The result of this analysis may be transmitted back to the fault detecting logic 160 as inwl_ok<7:0>. The fault detecting logic 160 may analyze each bit of the intermediate feedback signal inwl_ok<7:0> to determine whether any values indicate a fault was detected. In some embodiments, the local decoder 230 transmits a single intermediate feedback signal inwl_ok as opposed to a bus of feedback signals (e.g., inwl<7:0>). In such an embodiment, the single intermediate feedback signal inwl_ok may be generated within the local decoder 230 by comparing each bit of the inwl_ok<7:0> signals (e.g., via an AND operation) prior to transmitting the singular intermediate feedback signal inwl_ok to the fault detecting logic 160. Thus, the singular intermediate feedback signal inwl_ok may indicate the presence of a fault if any one of the bits of the inwl_ok<7:0> signals indicates a fault, and the singular intermediate feedback signal inwl_ok may indicate the absence of a fault if all of the bits of the inwl_ok<7:0> signals indicate the absence of a fault. As a result, one bit may be transmitted and received for this stage by the fault detecting logic 160 rather than eight bits.

The row decoder 240 (or column decoder) may be the final stage that includes decoder circuitry and integrated fault detection circuitry configured to detect a possible attack on the final stage of decoding signals.

Figure 4:
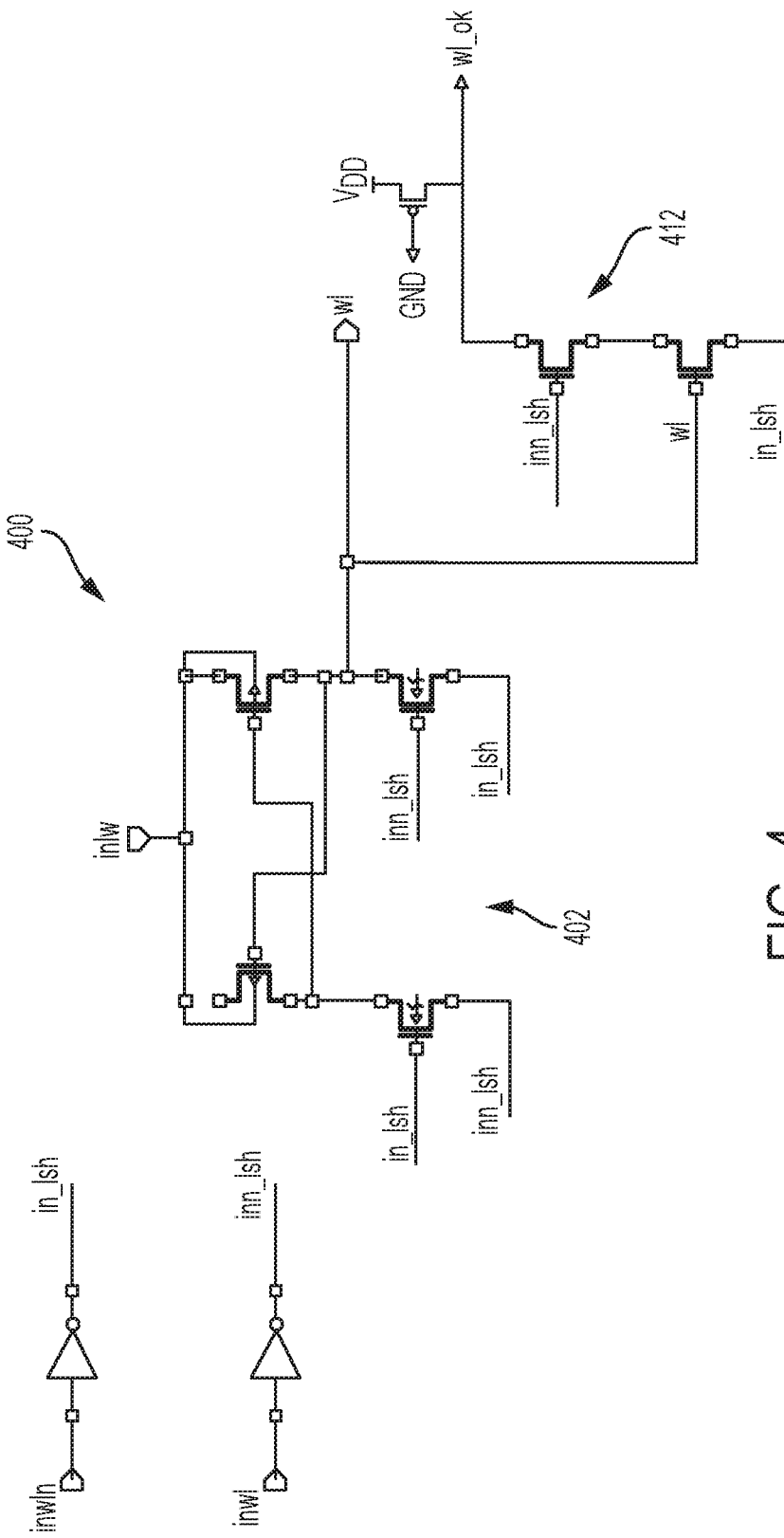
FIG. 4 is a schematic circuit diagram of the decoder circuitry and the integrated fault detection circuitry.

FIG. 4 is a schematic circuit diagram 400 of decoder circuitry 402 and integrated fault detection circuitry 412 for the row decoder 240 (FIG. 2). The integrated fault detection circuitry 412 is configured to determine (e.g., via an AND operation or other operation as desired) how each output bit of its decoder path compared to another bit within the decoder path to determine whether the output bit is its correct value. The result of this comparison may be transmitted back to the fault detecting logic 160 as wl_ok<31:0>. The fault detection circuitry 412 may include serially coupled transistors that receive the control inputs, and that are also coupled to a resistive pull up transistor to generate the feedback signal wl_ok.

The fault detecting logic 160 may analyze each bit of the final feedback signal wl_ok<31:0> to determine whether any values indicate a fault was detected. In some embodiment, the local decoder 230 transmits a single feedback signal wl_ok as opposed to a bus of feedback signals. In such an embodiment, the single feedback signal wl_ok may be generated within the row decoder 240 by comparing each bit (e.g., via an AND operation or other operation as desired) of the wl_ok<31:0> signals prior to transmitting the singular wl_ok feedback signal to the fault detecting logic 160. As a result, one bit may be transmitted and received for this stage by the fault detecting logic 160 rather than thirty-two bits.

As a result of one or more embodiments of the disclosure, detecting an attack to a memory device may be achieved, as well as identifying which level of decoding was compromised by the attack. In addition, utilization of a ROM device at the end of the row decoder may be eliminated, which may reduce the complexity of the fault detector by avoiding generating ROM timing signals as well as a less complicated wiring phase.

Additional embodiments include a method of detecting fault within a memory device. The method comprises decoding an input signal via a memory decoder including multiple stages in a decoding path to generate a select signal from an input address signal, and generating feedback signals distributed within the multiple stages, and transmitting the feedback signals to fault detecting logic indicative of a fault along the decoding path.

Another embodiment includes a method of detecting fault within a memory device. The method comprising detecting, via fault detecting logic for the memory device, a fault along a decoding path responsive to feedback signals distributed from multiple stages of a memory decoder of the memory device, and generating a fault alarm signal responsive to detecting the fault.

Figure 5:
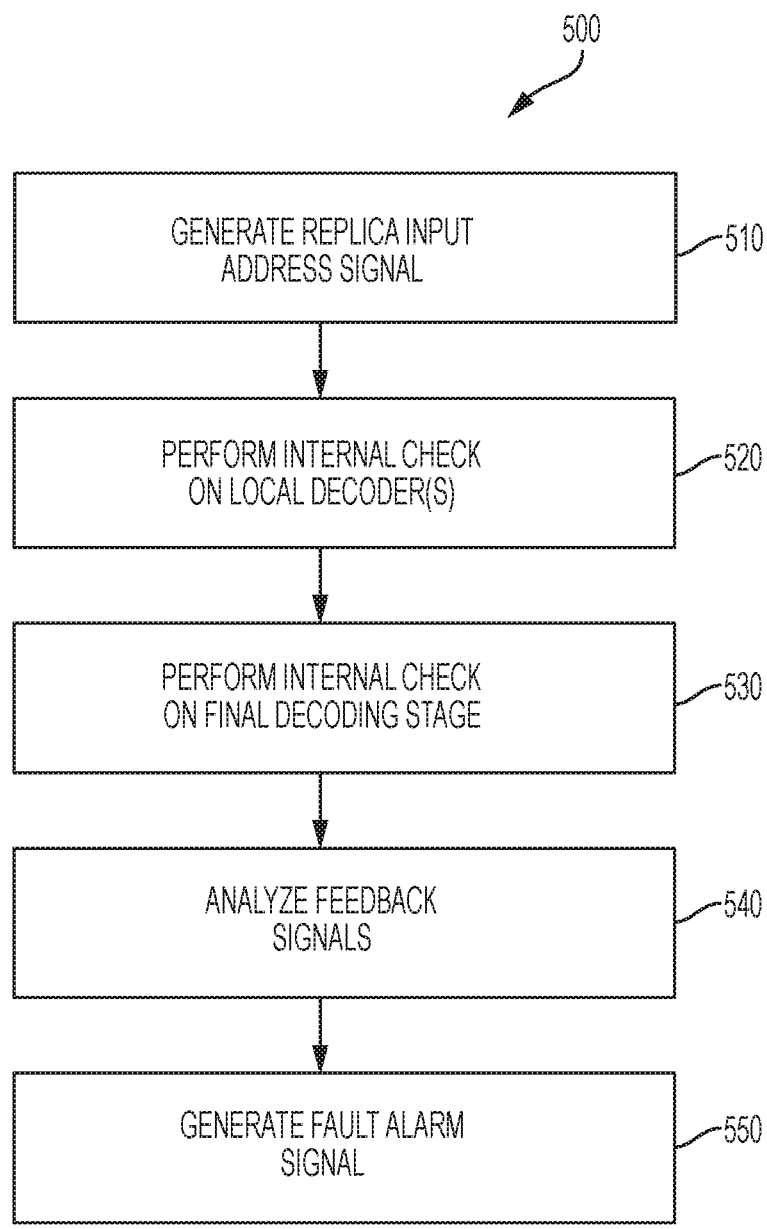
FIG. 5 is a flow chart illustrating a method of fault detection within an address decoder of a memory device.

FIG. 5 is a flow chart 500 illustrating a method of fault detection within an address decoder of a memory device. At operation 510, the method includes generating a replica input address signal. The replica input address signal may be generated with a global encoder performing a reverse encoding of the global decoder that received the initial input signal from the memory controller.

At operation 520, the method includes performing an internal check of the accuracy of one or more intermediate local decoder. The internal check may include comparing output bits generated by the intermediate local decoder with an internal reference bit to determine that the bits have not been changed by an attack.

At operation 530, the method includes performing an internal check of the accuracy of the final decoding stage (e.g., row decoder or column decoder) that generates the final decoded address for the memory array. The internal check may include comparing output bits generated by the final stage decoder with an internal reference bit to determine that the bits have not been changed by an attack.

At operation 540, the method includes analyzing feedback signals by the fault detecting logic to determine if an attack has occurred. The feedback signals may include signals generated by each of operations 510, 520, and 530 indicative of the results of the consistency checks performed. For example, the replica input address signal may be a feedback signal that is compared with the initial input address signal. If the two signals do not match, the fault control logic may determine that an attack has occurred. An intermediate feedback signal (e.g., a single bit or a bus of signals) may be sent from intermediate local decoders responsive to the internal checks being performed during operation 520 indicative of whether an attack has occurred on the intermediate local decoder. A final output feedback signal (e.g., a single bit or a bus of signals) may be sent from final stage decoder responsive to the internal checks being performed during operation 530 indicative of whether an attack has occurred on the final stage decoder.

At operation 550, the fault detecting logic may generate a fault alarm signal responsive to determining the presence of the fault along the decoder path. For example, the fault detecting logic may determine from any one of the feedback signals that a fault has occurred and generate the fault alarm signal accordingly.

FIG. 6 is a simplified schematic block diagram of an example electronic system 600 including a memory system 610 with fault detection according to embodiments of the disclosure. The electronic system 600 may include central processing unit (CPU) 602, Direct Memory Access (DMA) 604, peripheral(s) 606, a memory controller 608 and a memory system 610 coupled to system bus 612. The system bus 612 may include a data bus, address bus and control bus. Address signals are placed on the address bus by the memory controller 608 and/or the DMA 604 to read or write from the memory system 610. The memory system 610 includes a memory array and other circuitry and/or logic as discussed above with reference to FIGS. 1-5.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. An apparatus, comprising:
   a memory address decoder including multiple stages in a decoding path to generate a select signal from an input address signal, wherein each of at least two stages of the multiple stages includes respective integrated fault detection circuitry to:

detect an erred bit along a respective decoding path of the at least two stages; and generate a feedback signal indicative of the detected erred bit, and fault detecting logic operably coupled with the memory address decoder to receive the respective feedback signals distributed from the multiple stages indicative of a fault along the decoding path, the received feedback signals including feedback signals generated by the respective integrated fault detection circuitry of the at least two stages of the multiple stages.

2. The apparatus of claim 1, wherein the memory address decoder includes at least one global decoder, at least one local decoder, and at least one row decoder.

3. The apparatus of claim 2, comprising a global encoder to receive an output from the at least one global decoder and generate a replica input address signal.

4. The apparatus of claim 3, wherein the fault detecting logic is to compare the replica input address signal and the input address signal to determine the fault is present.

5. The apparatus of claim 3, wherein the at least one local decoder is to perform an internal comparison of each bit of its decoder output path with another bit within respective integrated fault detection circuitry coupled to the at least one local decoder.

6. The apparatus of claim 3, wherein the at least one row decoder is to perform an internal comparison of each bit of its decoder output path with another bit within respective integrated fault detection circuitry coupled to the at least one row decoder.

7. The apparatus of claim 1, wherein the apparatus is a memory device.

8. The apparatus of claim 1, wherein the memory address decoder includes a row decoder.

9. The apparatus of claim 1, wherein the memory address decoder includes a column decoder.

10. The apparatus of claim 1, comprising a microcontroller coupled with a memory device.

11. The apparatus of claim 10, wherein the microcontroller includes the fault detecting logic and the memory device includes the memory address decoder.

12. The apparatus of claim 10, wherein the memory device includes both the fault detecting logic and the memory address decoder.

13. A method, the method comprising:

decoding an input signal via a memory address decoder including multiple stages in a decoding path to generate a select signal from an input address signal;

performing fault detecting within at least two stages of the multiple stages in the decoding path;

detecting erred bits along a respective decoding path of the at least two stages at least partially responsive to the fault detecting;

generating feedback signals indicative of the detected erred bits, the feedback signals distributed within the multiple stages; and receiving, at fault detecting logic, feedback signals indicative of a fault along the decoding path, the received feedback signals comprising the generated feedback signals distributed within the multiple stages.

14. The method of claim 13, wherein receiving, at fault detecting logic the feedback signals comprises receiving the feedback signals at fault detecting logic located within a memory device.

15. The method of claim 13, wherein receiving, at fault detecting logic, the feedback signals comprises receiving the feedback signals at fault detecting logic located within a microcontroller operably coupled with a memory device.

16. The method of claim 13, wherein receiving, at fault detecting logic, the feedback signals comprises receiving the feedback signals at fault detecting logic located within a device external to the memory device.

17. The method of claim 13, comprising generating the feedback signals within at least one of a row decoder or a column decoder operably coupled to a memory array of a memory device.

18. The apparatus of claim 1, wherein the fault detecting logic is to associate the fault with a given stage of the multiple stages responsive to the feedback signal received from the given stage.

* * * * *

UNITED STATES PATENT AND TRADEMARK OFFICE
CERTIFICATE OF CORRECTION

PATENT NO. : 11,443,820 B2
APPLICATION NO. : 15/956526
DATED : September 13, 2022
INVENTOR(S) : Lorenzo Bedarida, Simone Bartoli and Albert S. Weiner It is certified that error appears in the above-identified patent and that said Letters Patent is hereby corrected as shown below:

On the Title Page
    In ITEM (57), Line 5, change "decoder include" to --decoder including--

In the Specification
        Column 4, Line 1, change "column 110 module" to --column I/O module--
        Column 4, Line 7, change "fault detection logic" to --fault detecting logic--
        Column 5, Line 4, change "signal signal to" to --signal to--
        Column 6, Line 31, change "inlw ok<0>." to --inlw_ok<0>.--
        Column 7, Line 18, change "The fault" to --The integrated fault--

In the Claims
    Claim 14, Column 10, Line 21, change "logic the" to --logic, the--
    Claim 16, Column 10, Line 31, change "to the memory" to --to a memory--

Signed and Sealed this
Twenty-fourth Day of January, 2023

*Katherine Kelly Vidal*

Katherine Kelly Vidal
*Director of the United States Patent and Trademark Office*